(12) United States Patent
Abhayagunawardhana et al.

(10) Patent No.: US 7,697,651 B2
(45) Date of Patent: Apr. 13, 2010

(54) LOCK SYSTEM AND METHOD FOR INTERPOLATOR BASED RECEIVERS

(75) Inventors: Chamath Abhayagunawardhana, Chandler, AZ (US); Arif Mahmud, Chandler, AZ (US); Kianoush Rahbar, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 1587 days.

(21) Appl. No.: 10/880,833

(22) Filed: Jun. 30, 2004

(65) Prior Publication Data

US 2006/0002502 A1 Jan. 5, 2006

(51) Int. Cl.
*H03D 3/24* (2006.01)
(52) U.S. Cl. .................. 375/373; 375/316; 375/327; 375/376
(58) Field of Classification Search ................ 375/316, 375/373, 327, 376
See application file for complete search history.

(56) References Cited

U.S. PATENT DOCUMENTS

| | | | |
|---|---|---|---|
| 4,606,052 A * | 8/1986 | Hirzel et al. ................ 375/333 |
| 6,552,619 B2 * | 4/2003 | Shastri ........................ 331/25 |
| 6,690,223 B1 * | 2/2004 | Wan ............................ 327/251 |
| 7,092,472 B2 * | 8/2006 | Stojanovic .................. 375/371 |
| 2003/0123594 A1 * | 7/2003 | Glenn et al. ................ 375/373 |
| 2004/0202266 A1 * | 10/2004 | Gregorius et al. ........... 375/355 |
| 2004/0252804 A1 * | 12/2004 | Aoyama ..................... 375/376 |
| 2005/0238055 A1 * | 10/2005 | Frodsham et al. ........... 370/474 |

* cited by examiner

*Primary Examiner*—Shuwang Liu
*Assistant Examiner*—Kabir A Timory (57) ABSTRACT

A tracking loop of an interpolator based receiver includes clock elements that generate a plurality of clocks to sample a signal from a remote transmitter. The tracking loop includes samplers and voter elements that sample the signal with the clocks and generate samples that comparatively indicate a phase relationship between the signal and the clocks. Based on the comparison of the samples in the samplers and voter elements, the tracking loop either sends phase-shift signals to the clock elements to shift the phase of the clocks to match the phase of the signal, or sends a phase-flip signal to the clock elements to flip the clocks if the phase relationship between the signal and the clocks is about 180°. Once a phase match between the clocks and the signal is established, the tracking loop remains phase locked with the signal and provides a recovered signal.

25 Claims, 8 Drawing Sheets

FIGS. 7a (top) and 7b (bottom)

FIG. 8

LOCK SYSTEM AND METHOD FOR INTERPOLATOR BASED RECEIVERS

FIELD OF THE DISCLOSURE

The present application generally relates to receivers, and more particularly, to a lock system and method for interpolator based receivers.

BACKGROUND

High speed interfaces typically employ either interpolator based tracking receivers or a more traditional PLL (Phase-Locked Loop) based tracking receivers. Both receivers use a tracking mechanism that tracks a remote transmitter's clock phase. The interpolator based receivers use timing information embedded in data edges of the remote transmitter to align a locally generated clock with the remote transmitter's clock. At start up, the tracking loop of the receiver adjusts the phase of a local clock to match the remote transmitter's clock. When the phase of the local clock substantially matches the phase of the remote transmitter's clock, the receiver locks to the remote transmitter's clock phase. The initial phase adjustment period of the receiver is typically referred to as lock time.

To reduce latency of high speed interfaces, tracking receivers can be designed to reduce lock time. In typical tracking receivers, lock time is proportional to the initial phase error and the granularity of the interpolator (i.e., the size of the phase correction steps). Because the largest lock time occurs when phase error is 180°, fine phase corrections at such a phase error can increase lock time. In contrast, large phase corrections will reduce lock time but may increase the phase error at lock condition.

DETAILED DESCRIPTION

Figure 1:
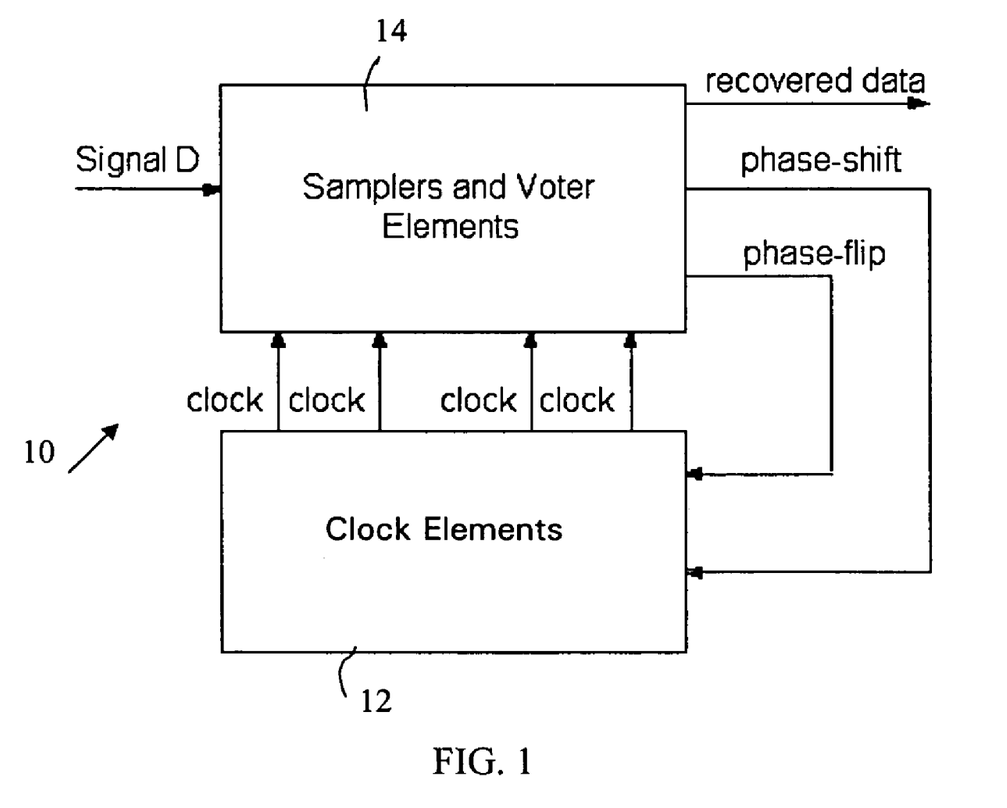
FIG. 1 is a block diagram showing a lock system and method for interpolator based receivers generally constructed in accordance with the teachings of the present disclosure.

Referring to FIG. 1, a tracking loop 10 of an interpolator based receiver having the disclosed lock system and method is generally shown. The tracking loop 10 includes clock elements 12 that generate a plurality of clocks to sample a signal D from a remote transmitter (not shown). In the disclosed example, the plurality of clocks includes four clocks. The tracking loop 10 includes samplers and voter elements 14 that sample the signal D with the four clocks and generate samples that comparatively indicate a phase relationship between the signal D and the four clocks. Based on the comparison of the samples in the samplers and voter elements 14, the tracking loop 10 either sends phase-shift signals to the clock elements 12 to shift the phase of the four clocks to match the phase of the signal D, or sends a phase-flip signal to the clock elements 12 to flip the four clocks if the phase relationship between the signal D and the four clocks is about 180°. Once a phase match between the four clocks and the signal D is established, the tracking loop 10 remains phase locked with the signal D and provides a recovered signal.

Figure 2:
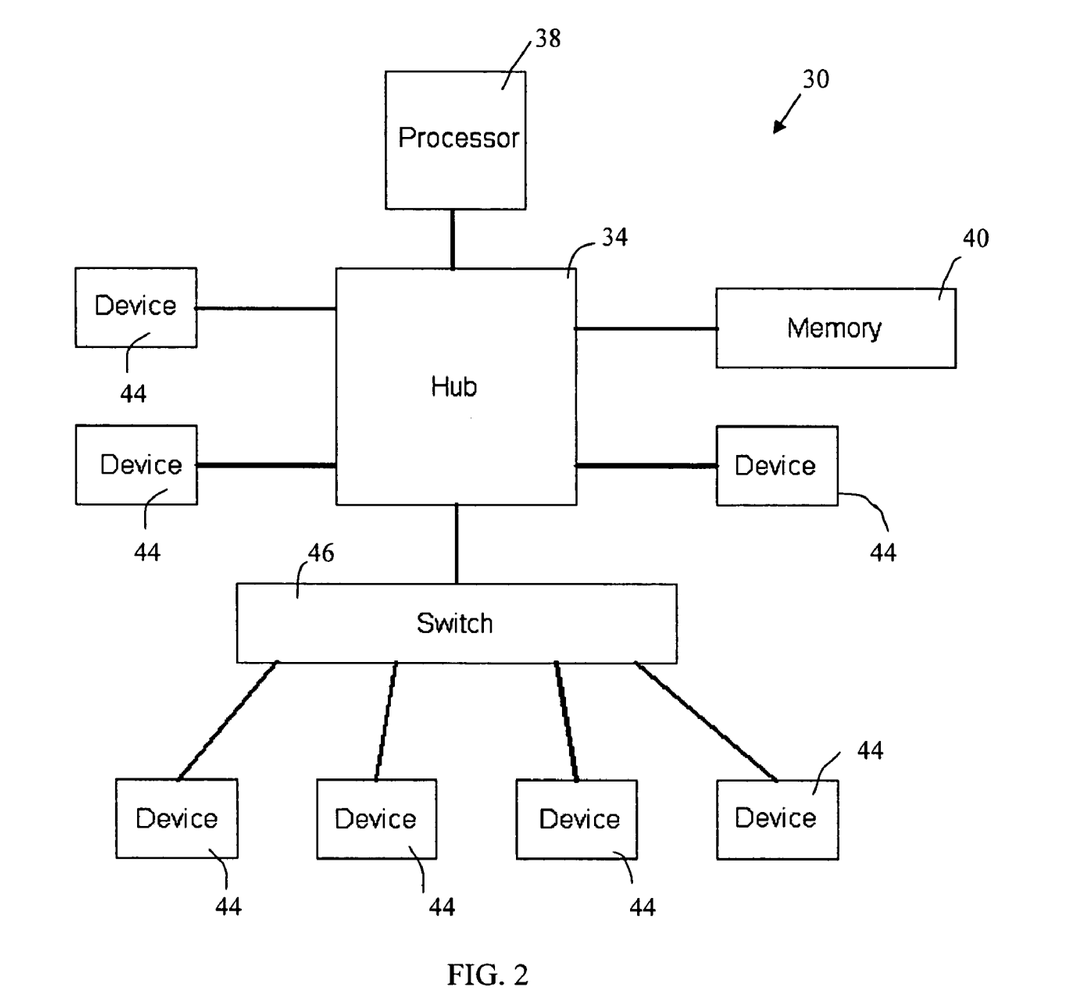
FIG. 2 is a schematic diagram of an exemplary computer system using the lock system and method of FIG. 1.

Referring to FIG. 2, a computer system 30 utilizing the disclosed lock system and method is generally shown. As used herein, "computer system" refers to any computer system (e.g., portable computer, laptop computer, PDA, desktop computer, server, etc.). The disclosed exemplary computer system 30 contains many conventional hardware components of a typical computer system, which may include a hub 34, a processor 38, and a memory 40. Even though the exemplary computer system 30 shows these components to be internal to the computer system 30, a person of ordinary skill in the art will appreciate that some of these components can alternatively be external to the computer system 30.

The computer system 30 may include a number of devices 44 that can be connected thereto to provide a variety of computing or other functions. For example, a device 44 can be an internally connected device such as a video capture card, or an externally connected device such as a video camera (not shown). The devices 44 can communicate with various components of the computer system 30, such as the processor 38 and the memory 40, through the hub 34. As shown in FIG. 2, the hub 34 may include a switch 46 for providing a common serial interface between the devices 44 for peer-to-peer communication of the devices 44 with each other and any of the above-described components of the computer system 30.

Figure 3:
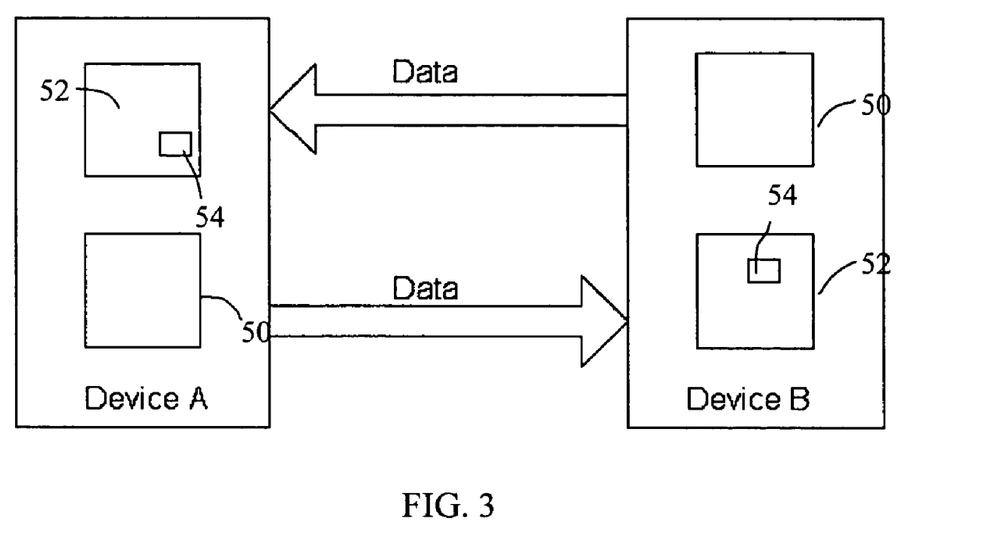
FIG. 3 is a schematic diagram of two exemplary devices of the computer system of FIG. 2.

Referring to FIG. 3, two exemplary devices 44, labeled as devices A and B, which are in communication with a common serial interface are shown. Each of the devices A and B includes a transmitter block 50 and an interpolator based receiver block 52 for sending and receiving signals, respectively. For device A to receive signals from device B, a clock 54 of device A must be able to approximately match the phase of the signal transmitted from device B. Similarly, for device. B to receive signals from device A, a clock 54 of device B must be able to approximately match the phase of the signal transmitted from device A. Each of the receiver blocks 52 of the devices A and B can include the tracking loop 10 having the disclosed lock system and method to provide the aforementioned phase matching. Accordingly, each of the devices 44 of the computer system 30 can include the disclosed tracking loop 10 to facilitate communication with the other devices 44.

Figure 4:
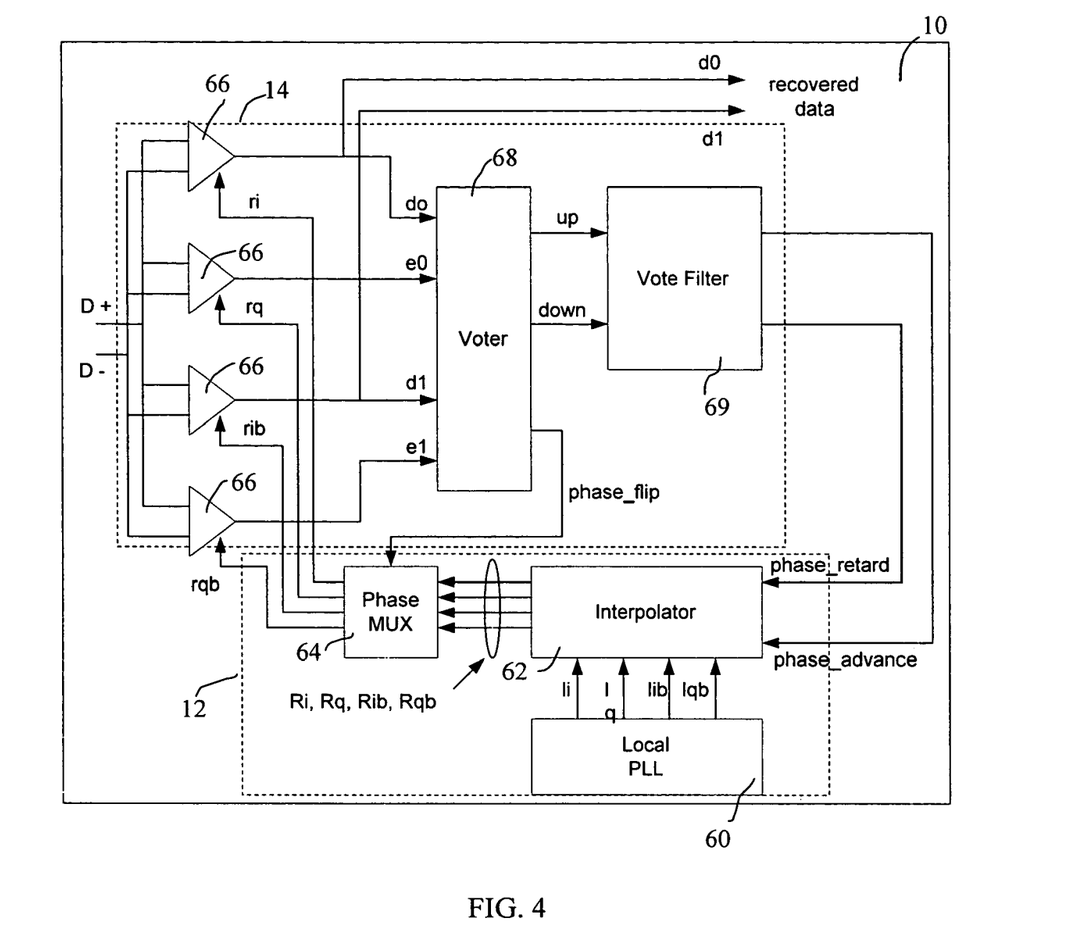
FIG. 4 is a block diagram showing details of the lock system and method of FIG. 1.

Referring to FIG. 4, the tracking loop 10 is shown in more detail. The tracking loop 10 receives the signal D in differential form (i.e., shown in FIG. 4 as D−/D+) from a remote transmitter (not shown). Each 360° of the signal is defined or represented by 1 bit period. Accordingly, the angular representation of a phase or a phase relationship in the present disclosure is interchangeably referred to by the noted bit period representation.

The clock elements 12 of the tracking loop 10 include a clock generator 60 that generates four clock phases li, lq, lib, and lqb, which are collectively referred to herein as clocks L. Each of the clocks L spans two bit periods and has a frequency equal to ½ the frequency of the signal D. The clock generator 60 may be a Phase-Lock Loop ("PLL") or a Delay-Lock Loop ("DLL"). In the disclosed example, the clock generator 60 is a PLL and will be referred to as PLL 60.

The clock elements 12 of the tracking loop 10 further include an interpolator 62 that receives the clocks L from the PLL 60. The interpolator in turn provides interpolated clocks Ri, Rq, Rib, and Rqb, which are collectively referred to herein as the interpolated clocks R. As will be described in detail below, the interpolated clocks R are either identical in phase to the clocks L, or have a shifted phase relative to the clocks L.

The clock elements 12 of the tracking loop 10 also include a phase multiplexer 64 (shown as phase MUX in FIG. 4) that receives the interpolated clocks R from the interpolator 62. The phase multiplexer 64 in turn provides four sampling clocks ri, rq, rib, and rqb, which will be collectively referred to herein as the sampling clocks r. As will be described in detail below, the sampling clocks r are either identical in phase to the interpolated clocks R, or have a phase that is flipped, i.e., a phase difference of 180°, relative the interpolated clocks R.

The samplers and voter elements 14 of the tracking loop 10 include samplers 66 corresponding in number to the clocks L that sample the signal D at the rising edge of each of the sampling clocks r. Each sample is in logical form (i.e., 1 or 0) and a group of 3 samples indicates whether the corresponding rising edge of the sampling clocks r is early or late with respect to the data edges.

Figure 5:
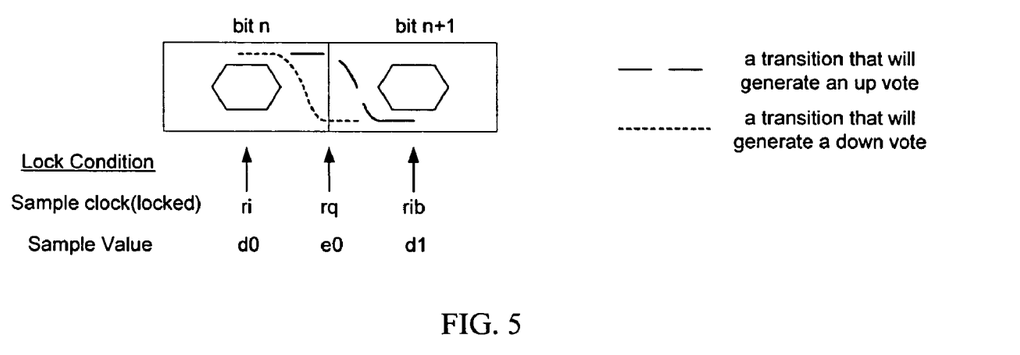
FIG. 5 is a diagram showing a lock state of the lock system and method of FIG. 4.

Referring to FIG. 5, because the sampling clocks r have a frequency that is ½ the frequency of the signal D and a period that spans two bits, the sampling clocks r take two samples for each bit of the signal D. Therefore, the sampling of two adjacent bits n and n+1 of the signal D with the samplers 66 generates four samples dn, en, dn+1, and en+1. In FIG. 5, 2 bit periods of the signal D is shown, each represented by a box. The hexagon shaped center represents the center of the signal D, where the edges of the signal cannot happen. This is typically called the eye diagram of the signal D. When the sampling clocks r are phase locked with the signal D, sampling clock phases ri and rib sample centers of the bits n and n+1, respectively, while the sampling clock phases rq and rqb sample the edges of the bits n and n+1, respectively. The sampling clocks r continuously sample the signal D and provide adjacent samples dn, en, dn+1 and en+1 at every n sampling iteration. To illustrate the disclosed lock system and method, the first iteration that results in samples d0, e0, d1, and e1, will be described in the following.

Figure 6:
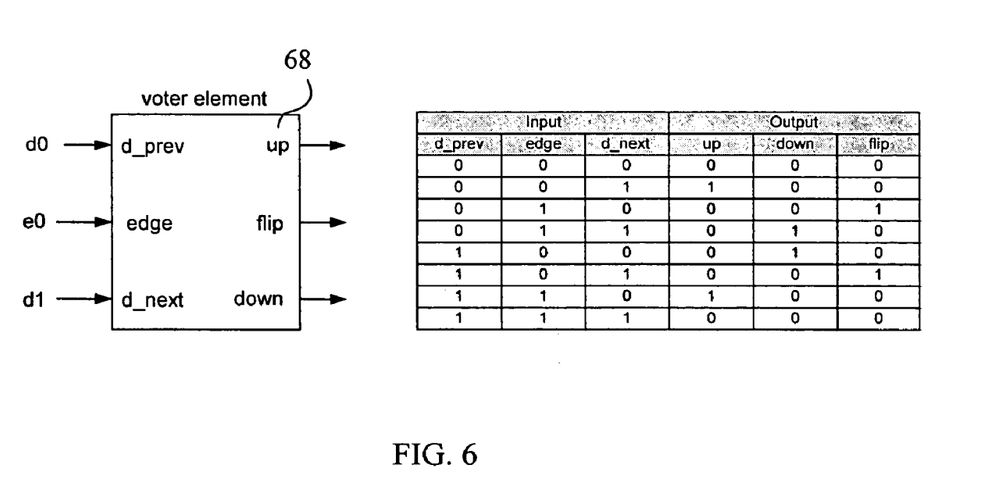
FIG. 6 is a diagram showing a voter element of the lock system and method of FIG. 4.

The samplers and voter elements 14 of the tracking loop 10 further include a voter element 68 that receives the samples d0, e0, d1, and e1 as inputs. Referring to FIG. 6, inputs and outputs of the voter element 68 are shown in both diagrammatic and tabular format. The voter element 68 uses a set of three adjacent samples {d0, e0, d1} to determine whether a phase-advance, phase-retard, or a phase-flip vote should be generated.

The voter element 68 generates a phase-advance vote if the sample set {d0,e0,d1} is either {0,0,1} or {1,1,0}, and a phase-retard vote if the sample set {d0,e0,d1} is {1,0,0} or {0,1,1}. As shown in FIG. 5, a phase-advance vote indicates that the sampling clocks lag in phase relative to the signal D. In contrast, a phase-retard vote indicates that the sampling clocks lead in phase relative to the signal D. The phase-advance and phase-retard votes are sent to a vote filter 69 (shown in FIG. 4). The vote filter 69 averages the votes and generates either a phase-advance or phase-retard signal, which is sent to the interpolator 64. Although the vote filter 69 is shown to be separate from the voter element 68, the vote filter 69 can also be an integral part of the voter element 68. The interpolator 64 incrementally shifts the phase of the clocks L to generate clocks R responsive to the phase-advance or phase-retard signal received from the vote filter 69. The phase shift increment of the interpolator 64 depends on the granularity of the interpolator 64. Accordingly, several sampling and voting iterations through the samplers 66, voter element 68, and the vote filter 69 may be required to approximately match the phase of the sampling clocks r with the signal D.

The voter element 68 generates a phase-flip vote if it encounters the sample sets {d0=1, e0=0, d1=1} or {d0=0, e0=1, d1=0}, which can only occur if the phase error between the sampling clocks r and the signal D is about ½ bit period or 180°. The reasoning for the occurrence of these sample sets is that if the phases of the sampling clock r are close to lock position with the signal D, two adjacent samples (e.g., d0 and d1) cannot be equal, without the edge sample (e.g., e0) collected at a time point in between them being the same value. Accordingly, the samples for the phase-flip are generated when ri and rib, are aligned to data transitions (edges) and rq and rqb are aligned to the center of the data eye. Therefore, a flip vote is generated if d0=d1 and e0 is not equal to d0, or written in algorithmic form:

Flip='1' if d0=d1 and e0 is not equal to d0, '0' else

One of ordinary skill in the art will readily appreciate that if the sampling clocks r are about 180° out of phase relative to the signal D, not all combinations of {d0,e0,d1} may produce the phase-flip condition of {1,0,1} or {0,1,0} because of an inherent unreliability in the samples taken at or near data transitions (i.e., edges) due to meta-stability. Additionally, because of the same unreliability in the samples, the sample sets {1,0,1} or {0,1,0} may result when the sampling clocks r are near and not exactly 180° out of phase relative to the signal D. When the sampling clocks r are about 180° out of phase relative to the signal D, the e0 sample is near the center of the eye of the data, which makes this sample a reliable sample. The samples d0 and d1, however, will be close to the data transitions (edges), which makes these samples unreliable. Accordingly, sampling only one set of {d0, e0, d1} may not indicate the about 180° phase difference between the sampling clocks r and the signal D. Therefore, all sets of the combinations {d0, e0, d1} are analyzed with a logical OR in the voter element 68 to provide the phase-flip signal as follows:

Phase-flip=flip$_1$ OR flip$_2$ OR . . . flip$_n$

Figure 7A:
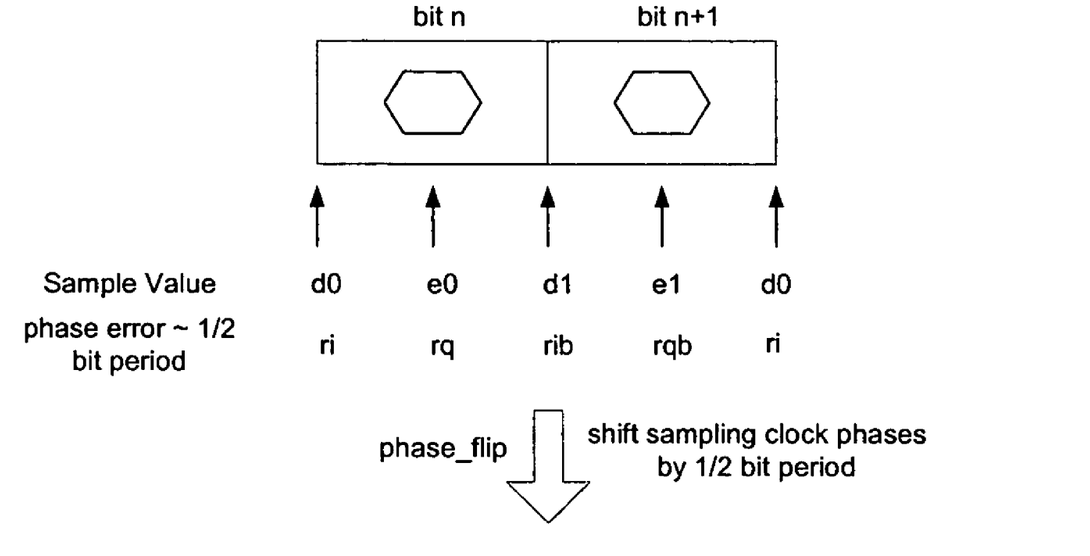
FIGS. 7a and 7b are diagrams showing a phase flip operation performed by the lock system and method of FIG. 4.
Figure 7B:
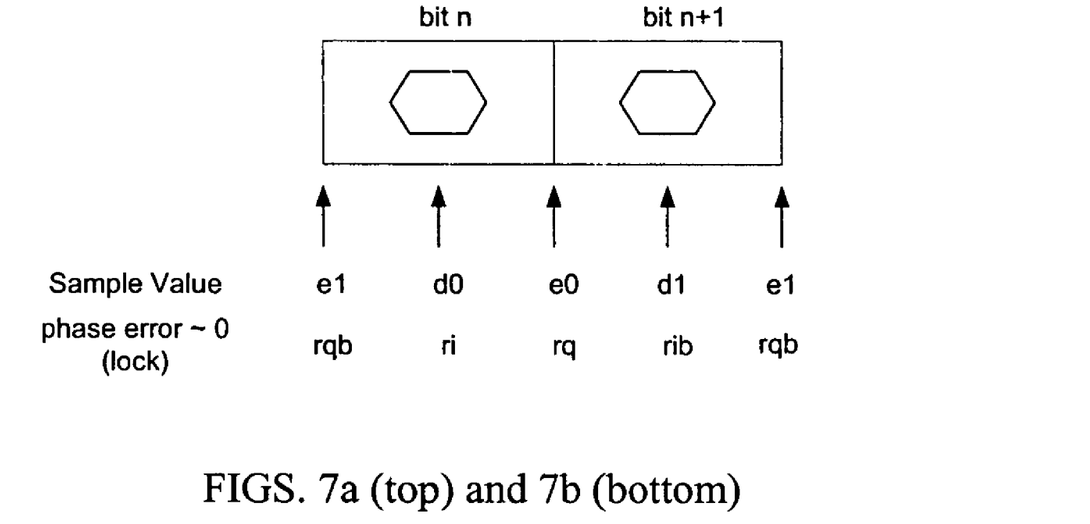

FIGS. 7a and 7b show how the phase-flip signal shifts the phase of the sampling clocks r by ½ bit period, which brings the sampling clocks r to near lock position. In FIG. 7a, sampling clocks r are ½ bit period or 180° out of phase relative to the signal D, which is the worst possible phase error with respect to the signal D. As shown in FIG. 7a, the sampling clock phases ri and rib, which should be aligned with the centers of the eyes of the signal D when locked, are aligned with the edges of the signal D. While, the sampling clock phases rq and rqb, which should be aligned with the edges of the signal D when locked, are aligned with the centers of the eyes of the signal D. FIG. 7b illustrates how the sampling clocks r should be shifted by ½ bit period or 180° after the phase multiplexer 64 receives a phase-flip signal from the voter element 68.

Figure 8:
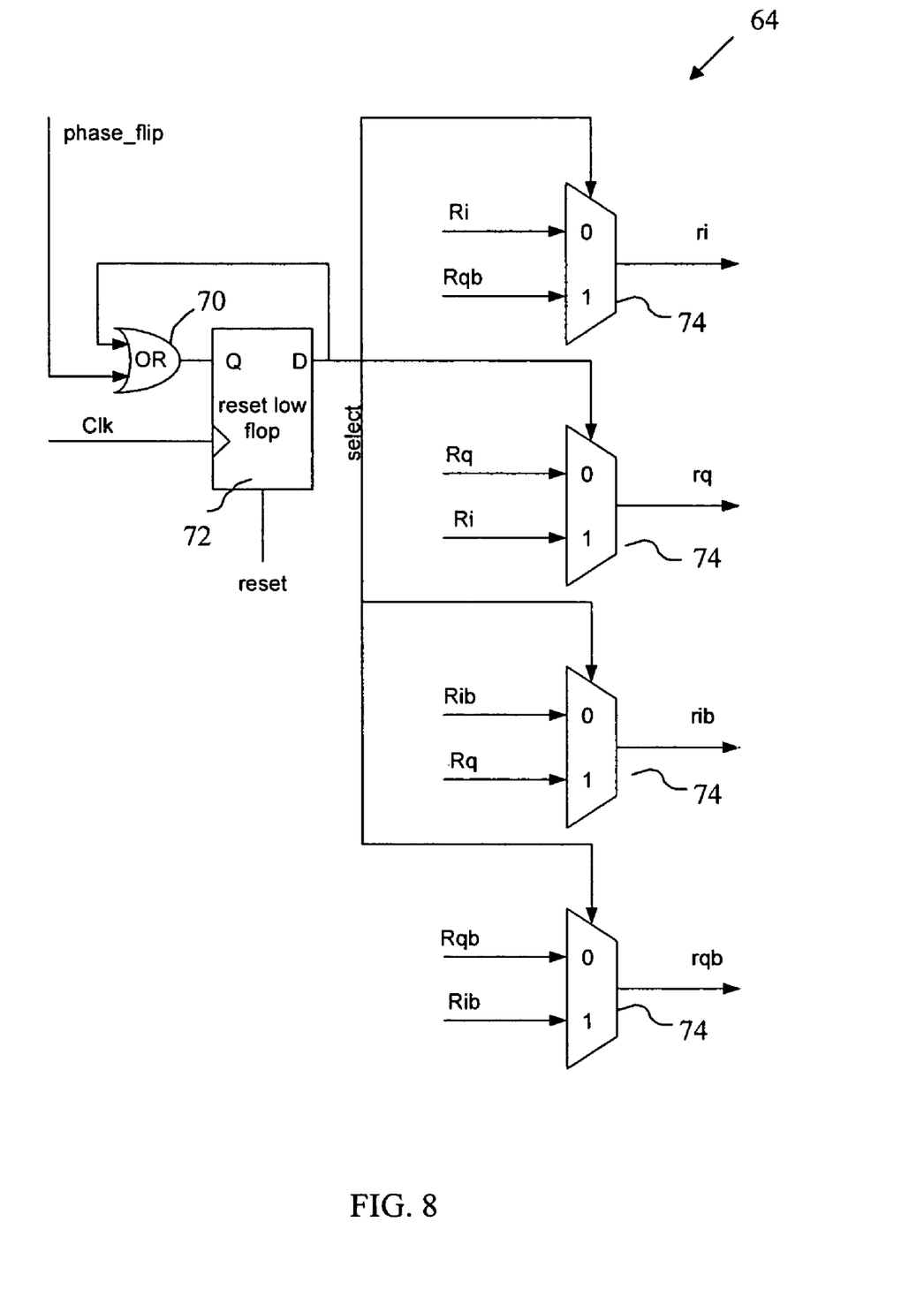
FIG. 8 is a block diagram of a phase multiplexer of the lock system and method of FIG. 4.

Referring to FIG. 8, the phase multiplexer 64 is shown in detail. The phase multiplexer 64 includes an OR gate 70, a flip-flop 72, and multiplexers 74. The inputs to the phase multiplexer 64 are the interpolated clocks R, the phase-flip signal from the voter element 68, a clock signal and a reset signal. The operation of the flip-flop 72 is based on the rising edge of the clock signal, which may be based on any of the disclosed clocks. The output of the phase multiplexer 64 is the sampling clock r. The flip-flop 72 receives a control signal from the OR gate 70 and sends the control signal to each of the multiplexers 74. The control signal is also fed back to the OR gate 70. In absence of a phase-flip='1' signal, the OR gate 70 sends logic '0' to the flip-flop 70, which in turn sends control signal logic '0' to the multiplexers 74. Accordingly, as shown in FIG. 6, the multiplexers 74 do not shift the sampling clocks r relative to the clocks R by ½ bit. In other words, the multiplexers assign the clock phases Ri, Rq, Rib, Rqb to clock phases ri, rq, rib, rqb, respectively.

When a phase-flip='1' signal is generated by the voter element 68, the OR gate 70 sends logic '1' to the flip-flop 72, which in turn sends the control signal logic '1' to the multiplexers 74. The control signal logic '1' causes the multiplexers to effectively shift the clocks r by ½ bit. This shift is performed by assigning Rqb to ri, Ri to rq, Rq to rib, and Rib to rqb. By feeding the control signal leaving the flip-flop 72 back to the OR gate 70, the control signal will lock to '1' after the first occurrence of phase-flip='1'. Accordingly, after the phase-flip of the sampling clock r, the phase remains permanently flipped. A reset signal can reset the flip-flop 72 so that the control signal unlocks to '0'. Such resetting may occur during a power-on reset procedure, such as when the tracking loop 10 is establishing a new interface with a remote transmitter.

Although the clocks L are shown and described herein to include four clock phases, more than four clock phases L can be provided by the PLL 60. One of ordinary skill in the art will appreciate that because the disclosed lock system and method takes two samples per received bit period of the signal D (i.e. after lock is achieved, one sample in center and one sample at the edge), the spacing between two adjacent clocks L should be ½ received bit period. Accordingly, more than four clocks may not increase the speed and efficiency of the disclosed system and method. However, to provide increased accuracy at the expense of speed, any number of sampling clocks can be provided that sample the signal D in parallel (i.e. redundant two samples per bit) with the four sampling clocks r. One of ordinary skill in the art will further appreciate that having a number of additional clocks with phase spacing less than ½ bit period may not provide an adjacent sample set {d0, e0, d1} that can indicate if the sampling clocks r are about 180° out of phase with the signal D.

One of ordinary skill in the art will appreciate that the disclosed phase lock system and method can be used in any device that requires a local clock to match the phase of a remote transmitter's clock. For example, the disclosed lock system and method can be used in a variety of computer systems and networks of computer systems, such as the disclosed exemplary computer system 30. In yet another example, the disclosed lock system and method can be used in cellular telephone communications networks. Each device in a cellular network can include the disclosed phase lock system and method to establish phase lock with a remote device in the network for communication.

Persons of ordinary skill in the art will appreciate that, although the teachings of the invention have been illustrated in connection with certain embodiments, there is no intent to limit the invention to such embodiments. On the contrary, the intention of this application is to cover all modifications and embodiments fairly falling within the scope of the teachings of the invention.

What is claimed is:

1. A phase lock method for interpolator based receivers comprising:
generating a plurality of clocks with equally spaced phases;
sampling a signal from a remote transmitter with the plurality of clocks, the sampling being indicative of a phase relationship between the signal and the plurality of clocks;
producing a phase-flip signal in response to determining that the phase relationship between the signal and the plurality of clocks is 180 degrees, and providing the phase-flip signal to a multiplexer receiving the plurality of clocks;
sending the phase-flip signal to an OR gate and generating a control signal;
sending the control signal to a flip-flop of the multiplexer, wherein the flip-flop is adapted to lock the control signal after a first occurrence of the control signal by feeding the control signal from the flip-flop back to the OR gate; and
flipping the plurality of clocks in response to receipt of the phase-flip signal in the multiplexer.

2. The phase lock method of claim 1, wherein each of the clocks spans two periods of the signal and has a frequency equal to half a frequency of the signal.

3. The phase lock method of claim 1, wherein the plurality of clocks comprises four clocks.

4. The phase lock method of claim 1, the sampling providing samples of the signal at rising edges of the clocks, wherein the samples are equal when the clocks are phase locked with the signal.

5. The phase lock method of claim 4, wherein the flipping comprises flipping the clocks if for any set of three adjacent samples of a plurality of sets of three adjacent samples, a first sample and a last sample are equal and not equal to a middle sample.

6. The phase lock method of claim 3, further comprising shifting the clocks if for any set of three adjacent samples of a plurality of sets of three adjacent samples, any two adjacent samples are equal and not equal to a remaining sample.

7. A phase lock method comprising:
generating a plurality of clocks;
interpolating the plurality of clocks to provide interpolated clocks, the interpolating including phase shifting of the plurality of clocks responsive to presence of a phase-shift signal;
multiplexing the plurality of interpolated clocks to provide multiplexed clocks, the multiplexing including phase flipping of the sampling clocks responsive to presence of a phase-flip signal;
sampling a signal from a remote transmitter with the plurality of sampling clocks to provide samples of the signal;
generating the phase-shift signal or the phase-flip signal responsive to comparing samples in a plurality of sets of three adjacent samples, the comparing indicating a phase relationship between the sampling clocks and the signal
sending the phase flip signal to an OR gate and generating a control signal; and
sending the control signal to a flip-flop of the multiplexer, wherein the flip-flop is adapted to lock the control signal after a first occurrence of the control signal.

8. The phase lock method of claim 7, wherein each of the plurality of clocks spans two periods of the signal and has a frequency equal to half a frequency of the signal.

9. The phase lock method of claim 7, wherein the plurality of clocks comprises four clocks.

10. The phase lock method of claim 7, wherein the samples are equal when the sampling clocks are phase locked with the signal.

11. The phase lock method of claim 7, wherein the phase flipping comprises flipping the multiplexed clocks if for any of the sets of three adjacent samples, a first sample and a last sample are equal and not equal to a middle sample.

12. The phase lock method of claim 7, wherein the phase shifting comprises phase shifting the plurality of clocks if for any of the sets of three adjacent samples, any two adjacent samples are equal and not equal to a remaining sample.

13. A lock system for a receiver comprising:
a clock generator adapted to generate a plurality of clocks having equally spaced phases;
an interpolator adapted to receive the plurality of clocks and provide a plurality of interpolated clocks;
a phase multiplexer adapted to receive the plurality of interpolated clocks and provide a plurality of sampling clocks;
samplers and voter elements adapted to receive the plurality of sampling clocks to sample a signal from a remote transmitter and generate a phase-shift signal and a phase-flip signal;
an OR gate to receive the phase-flip signal and generate a control signal;
a flip-flop adapted to receive the control signal and send the control signal back to the OR gate, the flip-flop adapted to lock the control signal after a first occurrence of the control signal; and
multiplexers adapted to flip a phase of the sampling clocks responsive to the first occurrence of the control signal from the flip-flop,
wherein the clock generator is to shift a phase of the plurality of sampling clocks based on the phase-shift signal from the samplers and voter elements and is to flip the phase of the plurality of sampling clocks based on the phase-flip signal from the samplers and voter elements.

14. The lock system of claim 13, wherein the clock generator is adapted to generate the plurality of clocks to span two periods of the signal and have a frequency equal to half a frequency of the signal.

15. The lock system of claim 13, the samplers and voter elements comprising:
a plurality of samplers adapted to sample a signal from a transmitter at rising edges of the plurality of sampling clocks to provide a plurality of samples indicative of a phase relationship between the sampling clocks and the signal; and
a voter element adapted to receive the samples and provide the phase-shift signal to the interpolator or the phase-flip signal to the phase multiplexer.

16. The lock system of claim 15, further comprising a vote filter adapted to average a plurality of the phase-shift signals and send the averaged phase-shift signal to the interpolator.

17. The lock system of claim 15, wherein the voter element is adapted to generate a phase-flip signal if for any set of three adjacent samples of a plurality of sets of three adjacent samples, a first sample and a last sample are equal and not equal to a middle sample.

18. The lock system of claim 15, wherein the voter element is adapted to generate a phase-shift signal any set of three adjacent samples of a plurality of sets of three adjacent samples, any two adjacent samples are equal and not equal to a remaining sample.

19. The lock system of claim 13, the phase-shift signal including a phase-advance signal if the plurality of sampling clocks lag in phase relative to the signal and a phase-retard signal if the sampling clocks lead in phase relative to the signal.

20. A computer system comprising:
a processor;
a memory in communication with the processor; and
a first device in communication with the processor and the memory, the first device including a receiver having a tracking loop adapted to change a phase of a clock embedded in the first device to substantially match a phase of a transmitter clock of a second device, the tracking loop comprising,
a clock generator adapted to generate a plurality of clocks having equally spaced phases,
an interpolator adapted to receive the plurality of clocks and provide interpolated clocks,
a phase multiplexer adapted to receive the plurality of interpolated clocks and provide a plurality of sampling clocks,
samplers and voter elements adapted to receive the plurality of sampling clocks to sample a signal from a remote transmitter and generate phase-shift signals and a phase-flip signal,
an OR gate to receive the phase-flip signal and generate a control signal;
a flip-flop adapted to receive the control signal and send the control signal back to the OR gate, the flip-flop adapted to lock the control signal after a first occurrence of the control signal, and
multiplexers adapted to flip a phase of the sampling clocks responsive to the first occurrence of the control signal from the flip-flop,
wherein the clock generator is to shift a phase of the plurality of sampling clocks based on a phase-shift signal from the samplers and voter elements and is to flip the phase of the plurality of sampling clocks based on the phase-flip signal from the samplers and voter elements,
and wherein the tracking loop is to flip the phase of the clock if the phase of the clock is offset by 180 degrees relative to the phase of the transmitter clock.

21. The computer system of claim 20, wherein the clock generator is adapted to generate the plurality of clocks to span two periods of the signal and have a frequency equal to half a frequency of the signal.

22. The computer system of claim 20, the samplers and voter elements comprising:
a plurality of samplers adapted to sample a signal from a transmitter at rising edges of the plurality of sampling clocks to provide a plurality of samples indicative of a phase relationship between the sampling clocks and the signal; and
a voter element adapted to receive the samples and provide the phase-shift signal to the interpolator or the phase-flip signal to the phase multiplexer.

23. The computer system of claim 22, further comprising a vote filter adapted to average a plurality of the phase-shift signals and send the averaged phase-shift signal to the interpolator.

24. The computer system of claim 22, wherein the voter element is adapted to generate a phase-flip signal if for any set of three adjacent samples of a plurality of sets of three adjacent samples, a first sample and a last sample are equal and not equal to a middle sample.

25. The computer system of claim 22, wherein the voter element is adapted to generate a phase-shift signal if for any set of three adjacent samples of a plurality of sets of three adjacent samples, any two adjacent samples are equal and not equal to a remaining sample.

* * * * *